United States Patent
Cho (10) Patent No.: US 12,120,908 B2
(45) Date of Patent: Oct. 15, 2024

(54) DISPLAY APPARATUS HAVING A LIGHT-EMITTING DEVICE AND A BANK INSULATING LAYER

(71) Applicant: LG Display Co., Ltd., Seoul (KR)

(72) Inventor: Jung Mo Cho, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 207 days.

(21) Appl. No.: 17/233,403

(22) Filed: Apr. 16, 2021

(65) Prior Publication Data

US 2022/0173360 A1    Jun. 2, 2022

(30) Foreign Application Priority Data

Nov. 30, 2020  (KR) .................... 10-2020-0163889

(51) Int. Cl.
| | | |
|---|---|---|
| *H10K 50/858* | (2023.01) | |
| *H10K 50/844* | (2023.01) | |
| *H10K 59/122* | (2023.01) | |
| H10K 50/15 | (2023.01) | |
| H10K 50/16 | (2023.01) | |
| H10K 50/17 | (2023.01) | |
| H10K 50/818 | (2023.01) | |
| H10K 50/828 | (2023.01) | |
| H10K 50/852 | (2023.01) | |
| H10K 102/00 | (2023.01) | |

(52) U.S. Cl.
CPC ......... *H10K 50/858* (2023.02); *H10K 50/844* (2023.02); *H10K 59/122* (2023.02); *H10K 50/15* (2023.02); *H10K 50/16* (2023.02); *H10K 50/17* (2023.02); *H10K 50/171* (2023.02); *H10K 50/818* (2023.02); *H10K 50/828* (2023.02); *H10K 50/852* (2023.02); *H10K 2102/3026* (2023.02)

(58) Field of Classification Search
None
See application file for complete search history.

(56) References Cited

U.S. PATENT DOCUMENTS

| | | | |
|---|---|---|---|
| 2016/0155979 A1* | 6/2016 | Yim .................... | H10K 50/858 257/40 |
| 2019/0123303 A1* | 4/2019 | Yasukawa ............ | H10K 50/844 |
| 2019/0355793 A1* | 11/2019 | Oh ....................... | H10K 59/122 |

FOREIGN PATENT DOCUMENTS

| | | |
|---|---|---|
| KR | 10-1244706 B1 | 3/2013 |
| KR | 10-2016-0065318 A | 6/2016 |
| KR | 10-2019-0131635 A | 11/2019 |
| KR | 10-2020-0082753 A | 7/2020 |
| KR | 10-2020-0132520 A | 11/2020 |

OTHER PUBLICATIONS

Korean Office Action dated Aug. 14, 2024 issued in Patent Application No. 10-2020-0163889 (8 pages).

* cited by examiner

*Primary Examiner* — Daniel Whalen
(74) *Attorney, Agent, or Firm* — POLSINELLI PC (57) ABSTRACT

A display apparatus having a light-emitting device and a bank insulating layer, the light-emitting device disposed on an emission area defined by the bank insulating layer, and a first capping layer, an insulation pattern and a second capping layer sequentially stacked on the bank insulating layer, and the insulation pattern has a refractive index greater than that of the first capping layer and the second capping layer, thereby minimizing unintended area in emitting light.

19 Claims, 4 Drawing Sheets

DISPLAY APPARATUS HAVING A LIGHT-EMITTING DEVICE AND A BANK INSULATING LAYER

CROSS REFERENCE TO RELATED APPLICATION

This application claims the priority benefit of Korean Patent Application No. 10-2020-0163889, filed on Nov. 30, 2020, which is hereby incorporated by reference in its entirety.

BACKGROUND

Field of the Disclosure

The present disclosure relates to a display apparatus in which a light-emitting device is disposed on an emission area defined by a bank insulating layer.

Description of the Background

Generally, an electronic appliance, such as a monitor, a TV, a laptop computer and a digital camera, includes a display apparatus to realize an image. For example, the display apparatus may include a light-emitting device. The light-emitting device may emit light displaying a specific color. For example, the light-emitting device may include a light-emitting layer between a first electrode and a second electrode.

The display apparatus may include a bank insulating layer to define an emission area in which light is emitted. For example, the light-emitting device may be disposed on the emission area defined by the bank insulating layer. However, in the display apparatus, the light may be emitted from an area on which the bank insulating layer is located, unintentionally. For example, in the display apparatus, the light may be generated and emitted from a portion of the light-emitting layer which is formed on the bank insulating layer due to misalignment. Thus, in the display apparatus, the quality of the image may be decreased.

SUMMARY

Accordingly, the present disclosure is directed to a display apparatus that substantially obviates one or more problems due to limitations and disadvantages of the prior art.

The present disclosure is to provide a display apparatus capable of minimizing the quality deterioration of the image due to the emission of the light generated in the unintended area.

Also, the present disclosure is to provide a display apparatus capable of blocking the emission of the light generated in a portion of the light-emitting layer which is formed on the bank insulating layer due to misalignment.

Additional advantages and features of the disclosure will be set forth in part in the description which follows and in part will become apparent to those having ordinary skill in the art upon examination of the following or may be learned from practice of the disclosure. The features and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus comprising a device substrate. A bank insulating layer is disposed on the device substrate. The bank insulating layer defines an emission area. A light-emitting device is disposed on the emission area. The light-emitting device includes a first electrode, a light-emitting layer and a second electrode, which are sequentially stacked on the emission area. A first capping layer is disposed on the light-emitting device. The first capping layer extends on the bank insulating layer. An insulation pattern and a second capping layer are disposed on the first capping layer. The insulation pattern overlaps the bank insulating layer. The second capping layer covers the insulation pattern. The insulation pattern has a refractive index greater than that of the first capping layer and the second capping layer.

The insulation pattern may be in contact with the first capping layer and the second capping layer.

The first capping layer may be in contact with the second electrode. A refractive index of the first capping layer may be smaller than that of the second electrode.

The light-emitting layer may include an emission material layer and an emission common layer. The emission common layer may be disposed between the emission material layer and the second electrode. The emission common layer being in contact with the second electrode may have a refractive index smaller than that of the second electrode.

The insulation pattern may have a refractive index greater than that of the second electrode.

The second capping layer may include a material different from the first capping layer.

The first capping layer may include an organic insulating material.

The insulation pattern may include a metal oxide.

A surface of the bank insulating layer toward the insulation pattern may have a curvature.

The surface of the bank insulating layer toward the insulation pattern may have a convex shape toward the insulation pattern.

In another aspect, the display apparatus includes a device substrate. A first electrode and a bank insulating layer are disposed on the device substrate. The bank insulating layer covers an edge of the first electrode. An emission material layer is disposed on a portion of the first electrode exposed by the bank insulating layer. The emission material layer includes a region overlapping with the bank insulating layer. A second electrode is disposed on the emission material layer. The second electrode has a higher transmittance than that of the first electrode. An insulation pattern is disposed on the bank insulating layer. The insulation pattern is spaced away from the portion of the first electrode exposed by the bank insulating layer. A first capping layer is disposed between the bank insulating layer and the insulation pattern. The first capping layer is in contact with a surface of the insulation pattern toward the bank insulating layer. A second capping layer is disposed on the insulation pattern. The second capping layer is in contact with a surface of the insulation pattern opposite to the bank insulating layer. The first capping layer and the second capping layer have a refractive index smaller than that of the insulation pattern.

A horizontal width of the insulation pattern may be equal to a horizontal width of the bank insulating layer.

An encapsulating element may be disposed on the second capping layer. The encapsulating element may include a portion disposed outside the bank insulating layer. Each of the first capping layer and the second capping layer may include a portion disposed between the second electrode and the encapsulating element.

The second capping layer may have a refractive index same as that of the first capping layer.

A surface of the bank insulating layer toward the insulation pattern may have a convex-concave shape.

BRIEF DESCRIPTION OF THE DRAWINGS

The accompanying drawings, which are included to provide a further understanding of the disclosure and are incorporated in and constitute a part of the disclosure, illustrate aspect(s) of the disclosure and together with the description serve to explain the principle of the disclosure.

In the drawings.

DETAILED DESCRIPTION

Hereinafter, details related to the above, technical configurations, and operational effects of the aspects of the present disclosure will be clearly understood by the following detailed description with reference to the drawings, which illustrate some aspects of the present disclosure. Here, the aspects of the present disclosure are provided in order to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1:
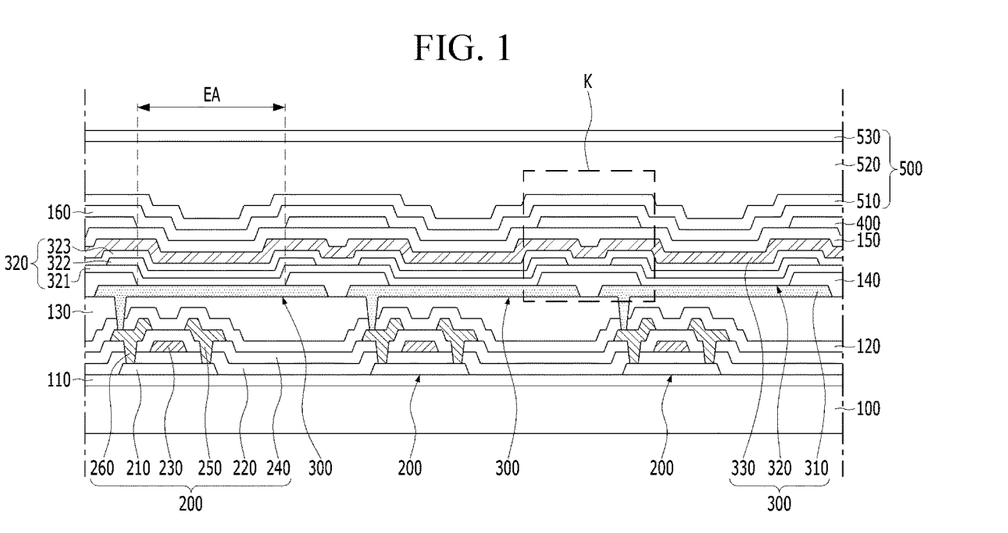
FIG. 1 is a view schematically showing a display apparatus according to an aspect of the present disclosure.
Figure 2:
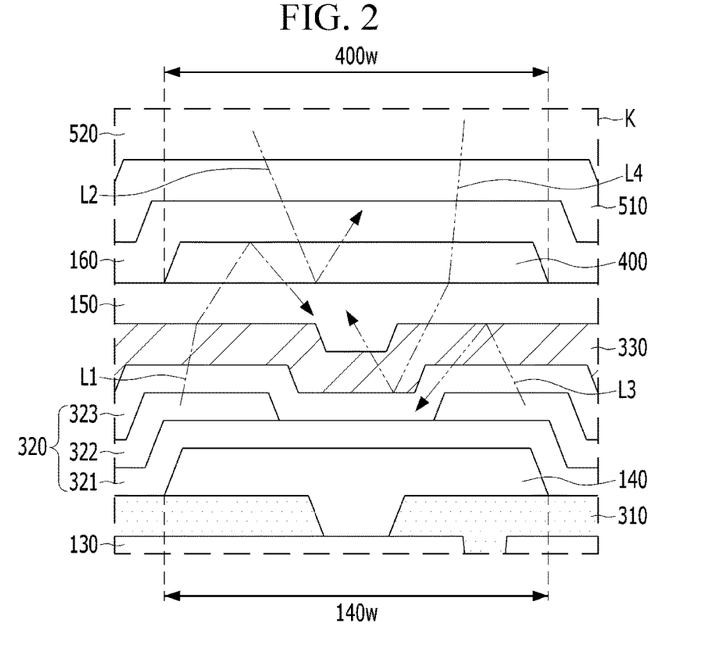
FIG. 2 is an enlarged view of K region in FIG. 1.

FIG. 1 is a view schematically showing a display apparatus according to an aspect of the present disclosure. FIG. 2 is an enlarged view of K region in FIG. 1.

Referring to FIGS. 1 and 2, the display apparatus according to the aspect of the present disclosure may include a device substrate 100. The device substrate 100 may include an insulating material. The device substrate 100 may include a material having a specific rigidity. For example, the device substrate 100 may include glass or plastic.

Driving circuits may be disposed on the device substrate 100. Each of the driving circuits may generate a driving current corresponding to a data signal according to a gate signal. For example, each of the driving circuits may include at least one thin film transistor 200. The thin film transistor 200 may include a semiconductor pattern 210, a gate insulating layer 220, a gate electrode 230, an interlayer insulating layer 240, a source electrode 250 and a drain electrode 260.

The semiconductor pattern 210 may include a semiconductor material. For example, the semiconductor pattern 210 may include amorphous silicon (a-Si) or polycrystalline silicon (poly-Si). The semiconductor pattern 210 may be an oxide semiconductor. For example, the semiconductor pattern 210 may include a metal oxide, such as IGZO. The semiconductor pattern 210 may include a source region, a drain region and a channel region. The channel region may be disposed between the source region and the drain region. The source region and the drain region may have a resistance lower than the channel region.

The gate insulating layer 220 may be disposed on the semiconductor pattern 210. The gate insulating layer 220 may extend beyond the semiconductor pattern 210. For example, a side surface of the semiconductor pattern 210 may be covered by the gate insulating layer 220. The gate insulating layer 220 may include an insulating material. For example, the gate insulating layer 220 may include silicon oxide (SiO) and/or silicon nitride (SiN). The gate insulating layer 220 may include a material having a high dielectric constant. For example, the gate insulating layer 220 may include a High-K material, such as hafnium oxide (HfO). The gate insulating layer 220 may have a multi-layer structure.

The gate electrode 230 may be disposed on the gate insulating layer 220. For example, the gate insulating layer 220 may be disposed between the semiconductor pattern 210 and the gate electrode 230. The gate electrode 230 may be insulated from the semiconductor pattern 210 by the gate insulating layer 220. The gate electrode 230 may include a conductive material. For example, the gate electrode 230 may include a metal, such as aluminum (Al), titanium (Ti), copper (Cu), chromium (Cr), molybdenum (Mo) and tungsten (W). The gate electrode 230 may overlap the channel region of the semiconductor pattern 210. For example, the channel region of the semiconductor pattern 210 may have an electric conductive corresponding to a voltage applied to the gate electrode 230.

The interlayer insulating layer 240 may be disposed on the gate electrode 230. The interlayer insulating layer 240 may extend beyond the gate electrode 230. For example, a side surface of the gate electrode 230 may be covered by the interlayer insulating layer 240. The interlayer insulating layer 240 may include an insulating material. For example, the interlayer insulating layer 240 may include silicon oxide (SiO).

The source electrode 250 may be disposed on the interlayer insulating layer 240. The source electrode 250 may include a conductive material. For example, the source electrode 250 may include a metal, such as aluminum (Al), titanium (Ti), copper (Cu), chromium (Cr), molybdenum (Mo) and tungsten (W). The source electrode 250 may include a material different from the gate electrode 230. The source electrode 250 may be electrically connected to the source region of the semiconductor pattern 210. For example, the gate insulating layer 220 and the interlayer insulating layer 240 may include a source contact hole partially exposing the source region of the semiconductor pattern 210. The source electrode 250 may be in direct contact with the source region of the semiconductor pattern 210 in the inside of the source contact hole.

The drain electrode 260 may be disposed on the interlayer insulating layer 240. The drain electrode 260 may include a conductive material. For example, the drain electrode 260 may include a metal, such as aluminum (Al), titanium (Ti), copper (Cu), chromium (Cr), molybdenum (Mo) and tungsten (W). The drain electrode 260 may include the same material as the source electrode 250. For example, the drain electrode 260 may include a material different from the gate electrode 230. The drain electrode 260 may be electrically connected to the drain region of the semiconductor pattern 210. For example, the gate insulating layer 220 and the interlayer insulating layer 240 may include a drain contact hole partially exposing the drain region of the semiconductor pattern 210. The drain electrode 260 may be in direct contact with the drain region of the semiconductor pattern 210 in the inside of the drain contact hole.

A device buffer layer 110 may be disposed between the device substrate 100 and the thin film transistors 200. The device buffer layer 110 may prevent pollution from the device substrate 100 during a process of forming the thin film transistors 200. For example, a surface of the device substrate 100 toward the thin film transistors 200 may be completely covered by the device buffer layer 110. The device buffer layer 110 may include an insulating material. For example, the device buffer layer 110 may include silicon oxide (SiO) and/or silicon nitride (SiN). The device buffer layer 110 may have a multi-layer structure.

A lower passivation layer 120 may be disposed on the driving circuits. The lower passivation layer 120 may prevent the damage of the driving circuits due to external impact and moisture. For example, the thin film transistor 200 of each driving circuit may be completely covered by the lower passivation layer 120. The lower passivation layer 120 may include an insulating material. For example, the lower passivation layer 120 may include an inorganic insulating material, such as silicon oxide (SiO) and silicon nitride (SiN).

An over-coat layer 130 may be disposed on the lower passivation layer 120. The over-coat layer 130 may remove a thickness difference due to the driving circuits. For example, a surface of the over-coat layer 130 opposite to the device substrate 100 may be a flat surface. The over-coat layer 130 may include an insulating material. The over-coat layer 130 may include a material different from the lower passivation layer 120. For example, the over-coat layer 130 may include an organic insulating material.

Light-emitting devices 300 may be disposed on the over-coat layer 130. Each of the light-emitting devices 300 may emit light display a specific color. For example, each of the light-emitting devices 300 may include a first electrode 310, a light-emitting layer 320 and a second electrode 330, which are sequentially stacked on the over-coat layer 130.

The first electrode 310 may include a conductive material. The first electrode 310 may have a high reflectivity. For example, the first electrode 310 may include a metal, such as aluminum (Al) and silver (Ag). The first electrode 310 may have a multi-layer structure. For example, the first electrode 310 may have a structure in which a reflective electrode formed of a metal is disposed between transparent electrodes formed of a transparent conductive material, such as ITO and IZO.

The light-emitting layer 320 may generate light having luminance corresponding to a voltage difference between the first electrode 310 and the second electrode 330. For example, the light-emitting layer 320 may include an emission material layer (EML) having an emission material. The emission material may include an organic material, an inorganic material or a hydride material. For example, the display apparatus according to the aspect of the present disclosure may be an organic light-emitting display apparatus including the light-emitting layer 320 of each light-emitting device 300 formed of an organic material.

The light-emitting layer 320 may have a multi-layer structure. For example, the light-emitting layer 320 may further include at least one of a first emission common layer 321 between the first electrode 310 and the emission material layer 322, and a second emission common layer 323 between the emission material layer 322 and the second electrode 330. Electrons and holes supplied from the first electrode 310 and the second electrode 320 may smoothly flow into the emission material layer 322 by the first emission common layer 321 and/or the second emission common layer 323. For example, each of the first emission common layer 321 and the second emission common layer 323 may include at least one of a hole injection layer (HIL), a hole transport layer (HTL), an electron transport layer (ETL) and an electron injection layer (EIL). Thus, in the display apparatus according to the aspect of the present disclosure, the luminous efficiency of the light-emitting layer 320 may be improved.

The second electrode 330 may include a conductive material. The second electrode 330 may include a material different from the first electrode 310. The second electrode 330 may have a higher transmittance than that of the first electrode 310. For example, the second electrode 330 may be a transparent electrode formed of a transparent conductive material, such as ITO and IZO. Thus, in the display apparatus according to the aspect of the present disclosure, the light generated by the light-emitting layer 320 may be emitted through the second electrode 330. Each of the light-emitting devices 330 may include a micro-cavity structure. For example, the second electrode 330 of each light-emitting device 300 may be a semi-transparent electrode including a metal alloy, such as MgAg. Therefore, in the display apparatus according to the aspect of the present disclosure, light extraction efficiency may be improved.

Each of the light-emitting devices 300 may be electrically connected to one of the driving circuits. For example, the first electrode 310 of each light-emitting device 300 may be electrically connected to the drain electrode 260 of one of thin film transistors 200. The lower passivation layer 120 and the over-coat layer 130 may include electrode contact holes exposing a portion of each driving circuit. For example, the first electrode 310 of each light-emitting device 300 may be in direct contact with the drain electrode 260 of the corresponding thin film transistor 200 via one of the electrode contact holes.

A bank insulating layer 140 may be disposed on the over-coat layer 130. The bank insulating layer 140 may include an insulating material. For example, the bank insulating layer 140 may include a material different from an organic insulating material. The bank insulating layer 140 may include a material different from the over-coat layer 130. The bank insulating layer 140 may define emission areas EA. The first electrode 310, the light-emitting layer 320 and the second electrode 330 of each light-emitting device 300 may be stacked on one of the emission areas EA defined by the bank insulating layer 140. For example, the first electrode 310 of each light-emitting device 300 may include an edge covered by the bank insulating layer 140. Thus, in the display apparatus according to the aspect of the present disclosure, the light-emitting devices 300 may be driven, independently.

The light-emitting layer 320 of each light-emitting device 300 may include a portion overlapping with the bank insulating layer 140. For example, the first emission common layer 321 and the second emission common layer 323 of each light-emitting device 300 may extend on the bank insulating layer 140. The first emission common layer 321 and the second emission common layer 323 of each light-emitting device 300 may be coupled to the first emission common layer 321 and the second emission common layer 323 of each light-emitting device 300. For example, the bank insulating layer 140 may be covered by the first emission common layer 321. The light emitted from each light-emitting device 300 may display a color different from the light emitted from adjacent light-emitting device 300. For example, the emission material layer 322 of each light-emitting device 300 may be spaced away from the emission material layer 322 of adjacent light-emitting device 300. The emission material layer 322 of each light-emitting device 300 may include an end on the bank insulating layer 140.

A voltage applying to the second electrode 330 of each light-emitting device 300 may the same as a voltage applying to the second electrode 330 of adjacent light-emitting device 300. For example, the second electrode 330 of each light-emitting device 300 may be electrically connected to the second electrode 330 of adjacent light-emitting device 300. The second electrode 330 of each light-emitting device 300 may extend on the bank insulating layer 140. The second electrode 330 of each light-emitting device 300 may include the same material as the second electrode 330 of adjacent light-emitting device 300. The second electrode 330 of each light-emitting device 300 may be in direct contact with the second electrode 330 of adjacent light-emitting device 300. For example, the second electrode 330 of each light-emitting device 300 may be simultaneously formed with the second electrode 330 of adjacent light-emitting device 300. Thus, in the display apparatus according to the aspect of the present disclosure, the luminance of the light emitted from each light-emitting device 300 may be controlled by the corresponding driving circuit.

A first capping layer 150 and a second capping layer 160 may be stacked on the light-emitting devices 300. The first capping layer 150 and the second capping layer 160 may prevent the damage of the light-emitting devices 300 due to the external impact and moisture. The first capping layer 150 and the second capping layer 160 may include an insulating material. The second capping layer 160 may include a material different from the first capping layer 150. For example, the first capping layer 150 may include an organic insulating material, and the second capping layer 160 may include an inorganic insulating material. Thus, in the display apparatus according to the aspect of the present disclosure, a thickness difference due to the light-emitting devices 300 may be relieved by the first capping layer 150, and a partial separation of the second capping layer 160 may be prevented. Therefore, in the display apparatus according to the aspect of the present disclosure, the damage of the light-emitting devices 300 may be effectively prevented by the first capping layer 150 and the second capping layer 160.

An insulation pattern 400 may be disposed on the bank insulating layer 140. The insulation pattern 400 may be disposed between the first capping layer 150 and the second capping layer 160. For example, the first capping layer 150 may be in direct contact with a surface of the insulation pattern 400 toward the bank insulating layer 140, and a surface of the insulation pattern 400 opposite to the bank insulating layer 140 may be in direct contact with the second capping layer 160. The second capping layer 160 may cover the insulation pattern 400. For example, a side surface of the insulation pattern 400 may be in direct contact with the second capping layer 160. The insulation pattern 400 may include an insulating material. The insulation pattern 400 may have a refractive index greater than that of the first capping layer 150 and second capping layer 160. For example, the insulation pattern 400 may include a metal oxide having a refractive index of 2.0 or higher, such as titanium oxide (TiO) and tantalum oxide (TaO). Thus, in the display apparatus according to the aspect of the present disclosure, the light L1 generated from a portion of the light-emitting layer 320 which overlaps the bank insulating layer 140 may be reflected in a direction of the device substrate 100 at the interface between the insulation pattern 400 and the second capping layer 160. That is, in the display apparatus according to the aspect of the present disclosure, the emission of the light L1 generated a region disposed outside the emission regions EA which are defined by the bank insulating layer 140 may be prevented. Therefore, in the display apparatus according to the aspect of the present disclosure, the variation of the color coordinates due to the light L1 generated in an unintended area may be prevented.

The insulation pattern 400 may overlap the bank insulating layer 140. For example, the insulation pattern 400 may be spaced away from the portion of each first electrode 310 exposed by the bank insulating layer 140. Thus, in the display apparatus according to the aspect of the present disclosure, the light emitted from each emission area EA may be not reflected in the direction of the device substrate 100 due to a difference in the refractive index between the insulation pattern 400 and the second capping layer 160. That is, the display apparatus according to the aspect of the present disclosure, a decrease of the light extraction efficiency due to the insulating pattern 400 may be prevented. A horizontal width 400w of the insulation pattern 400 may be the same as a horizontal width 140w of the bank insulating layer 140. Thus, in the display apparatus according to the aspect of the present disclosure, only the light generated from the emission areas EA may be emitted outside.

The second capping layer 160 may be in direct contact with the first capping layer 150 in the outside of the insulation pattern 400. The second capping layer 160 may have a refractive index greater than that of the first capping layer 150. Thus, in the display apparatus according to the aspect of the present disclosure, the light emitted from the light-emitting device 300 of each emission area EA may be not reflected in the interface between the first capping layer 150 and the second capping layer 160. Therefore, in the display apparatus according to the aspect of the present disclosure, a decrease of the light extraction efficiency may be prevented.

An encapsulating element 500 may be disposed on the second capping layer 160. The encapsulating element 500 may prevent the damage of the light-emitting devices 300 due to the external impact and moisture. For example, the encapsulating element 500 may include a region overlapping with the light-emitting devices 300 and a region overlapping with the bank insulating layer 140. Each of the light-emitting devices 300 may be completely covered by the encapsulating element 500. The encapsulating element 500 may have a multi-layer structure. For example, the encapsulating element 500 may include a first encapsulating layer 510, a second encapsulating layer 520 and a third encapsulating layer 530, which are sequentially stacked on the second electrode 330 of each light-emitting device 300. The first encapsulating layer 510, the second encapsulating layer 520 and the third encapsulating layer 530 may include an insulating material. The second encapsulating layer 520 may include a material different from the first encapsulating layer 510 and the third encapsulating layer 530. For example, the first encapsulating layer 510 and the third encapsulating layer 530 may include an inorganic material, and the second encapsulating layer 520 may include an organic material. Thus, in the display apparatus according to the aspect of the present disclosure, the damage of the light-emitting devices 300 due to the external impact and moisture may be effectively presented. A thickness difference due to the light-emitting devices 300 may be removed by the second encapsulating layer 520. For example, a surface of the encapsulating element 500 opposite to the device substrate 100 may be a flat surface.

In the display apparatus according to the aspect of the present disclosure, a light L2 travelling toward the bank insulating layer 140 through the encapsulating element 500 may be reflected in the interface between the first capping layer 150 and the insulation pattern 400. That is, in the display apparatus according to the aspect of the present disclosure, external light, such as UV light may not flow into the bank insulating layer 140. Thus, in the display apparatus according to the aspect of the present disclosure, the outgassing of the bank insulating layer 140 due to the external light may be prevented. A gas discharged from the bank insulating layer 140 may flow into adjacent light emitting regions EA. Therefore, in the display apparatus according to the aspect of the present disclosure, the damage of the light-emitting devices 300 due to the outgassing of the bank insulating layer 140 may be presented.

Accordingly, the display apparatus according to the aspect of the present disclosure may include the insulation pattern 400 on the bank insulating layer 140 defining the emission areas EA, the first capping layer 150 being in direct contact with the surface of the insulation pattern 400 toward the bank insulating layer 140, and the second capping layer 160 being in direct contact with the surface of the insulation pattern 400 opposite to the bank insulating layer 140, wherein the insulation pattern 400 may have a refractive index greater than that of the first capping layer 150 and the second capping layer 160. Thus, in the display apparatus according to the aspect of the present disclosure, the light generated on the bank insulating layer 140 may be reflected toward the device substrate 100 in the interface between the insulation pattern 400 and the second capping layer 160, and the external light may be reflected toward the encapsulating element 500 in the interface between the first capping layer 150 and the insulation pattern 400. That is, in the display apparatus according to the aspect of the present disclosure, the emission of the light generated from the unintended area, and the damage of the light-emitting devices 300 due to the external light may be prevented. Therefore, in the display apparatus according to the aspect of the present disclosure, the quality of the image may be improved.

Furthermore, in the display apparatus according to the aspect of the present disclosure, the light generated from an unintended area and the external light may be reflected in the interface between the insulation pattern 400 and the second capping layer 160 which are composed of an insulating material, or the interface between the first capping layer 150 and the insulation pattern 400 which are composed of an insulating material. That is, in the display apparatus according to the aspect of the present disclosure, the parasitic capacitance and a vertical electric field due to components disposed on the bank insulating layer 140 for blocking the light generated in an unintended area and/or the external light may be prevented. Thus, in the display apparatus according to the aspect of the present disclosure, the operation of the light-emitting device 300 due to unintended electric field may be prevented. Therefore, in the display apparatus according to the aspect of the present disclosure, the deterioration of the image due to the malfunction of the light-emitting device 300.

The second electrode 330 may be in direct contact with the first capping layer 150. The second electrode 330 may have a refractive index greater than that of the first capping layer 150. Thus, in the display apparatus according to the aspect of the present disclosure, the light L3 generated from the portion of the light-emitting layer 320 which overlaps the bank insulating layer 140 may be reflected toward the device substrate 100 in the interface between the second electrode 330 and the first capping layer 150. And, in the display apparatus according to the aspect of the present disclosure, the light L1 passing though the interface between the second electrode 330 and the first capping layer 150 may be reflected toward the device substrate 100 in the interface between the insulation pattern 400 and the second capping layer 160. For example, the insulation pattern 400 may have a refractive index greater than that of the second electrode 330. The light L1 which is not reflected in the interface between the second electrode 330 and the first capping layer 150 may be refracted in the interface between the second electrode 330 and the first capping layer 150. That is, in the display apparatus according to the aspect of the present disclosure, the light L1 and L3 generated from a region disposed outside the emission areas EA may be reflected or refracted in the interface between the second electrode 330 and the first capping layer 150. Therefore, in the display apparatus according to the aspect of the present disclosure, the emission of the light L1 and L3 generated from an unintended region may be effectively prevented.

The second emission common layer 323 may be in direct contact with the second electrode 330. The second emission common layer 323 may have a refractive index smaller than that of the second electrode 330. Thus, in the display apparatus according to the aspect of the present disclosure, the light L4 passing though the interface between the insulation pattern 400 and the first capping layer 150 may be reflected toward the encapsulating element 500 in the interface between the second emission common layer 323 and the second electrode 330. The light L4 which is not reflected in the interface between the second emission common layer 323 and the second electrode 330 may be refracted in the interface between the second emission common layer 323 and the second electrode 330. That is, in the display apparatus according to the aspect of the present disclosure, the light L2 and L4 travelling toward the bank insulating layer 140 through the encapsulating element 500 may be reflected or refracted in the interface between the insulation pattern 400 and the first capping layer 150, and the light L4 refracted in the interface between the insulation pattern 400 and the first capping layer 150 may be reflected in the interface between the second common layer 323 and the second electrode 330. Therefore, in the display apparatus according to the aspect of the present disclosure, the outgassing of the bank insulating layer 140 due to the external light L2 and L4 may be effectively prevented.

The display apparatus according to the aspect of the present disclosure is described that the second capping layer 160 includes a material different from the first capping layer 150. However, the display apparatus according to another aspect of the present disclosure may comprise the first capping layer 150 and the second capping layer 160 which includes the same material. For example, in the display apparatus according to another aspect of the present disclosure, the first capping layer 150 and the second capping layer 160 may include an inorganic material, such as silicon oxide (SiO) and silicon nitride (SiN). The second capping layer 160 may have a refractive index same as that of the first capping layer 150. Thus, in the display apparatus according to another aspect of the present disclosure, the emission efficiency of the light emitted from the emission areas EA may be improved.

Figure 3:
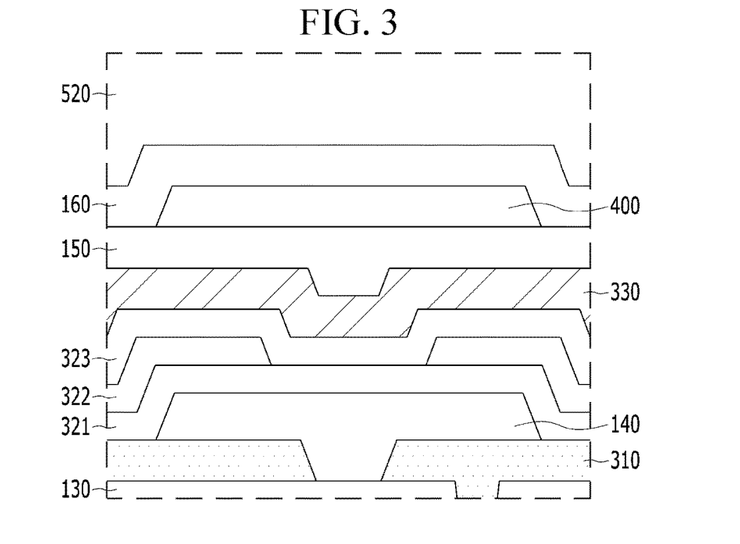
FIGS. 3 to 7 are views respectively showing the display apparatus according to another aspect of the present disclosure.

The display apparatus according to the aspect of the present disclosure is described that the encapsulating element 500 on the second capping layer 160 has a structure in which the second encapsulating layer 520 formed of an organic material is disposed between the first encapsulating layer 510 and the third encapsulating layer 530 which are formed of inorganic material. However, the display apparatus according to another aspect of the present disclosure may include the encapsulating element 500 having a various structure. For example, in the display apparatus according to another aspect of the present disclosure, the second encapsulating layer 520 formed of an organic material may be in direct contact with the second capping layer 160, as shown in FIG. 3. The second capping layer 160 may include an inorganic material. For example, the second capping layer 160 may perform the same function as the first encapsulating layer. Thus, in the display apparatus according to another aspect of the present disclosure, the degree of freedom in the configuration of the encapsulating element may be improved. And, in the display apparatus according to another aspect of the present disclosure, process efficiency may be improved.

Figure 4:
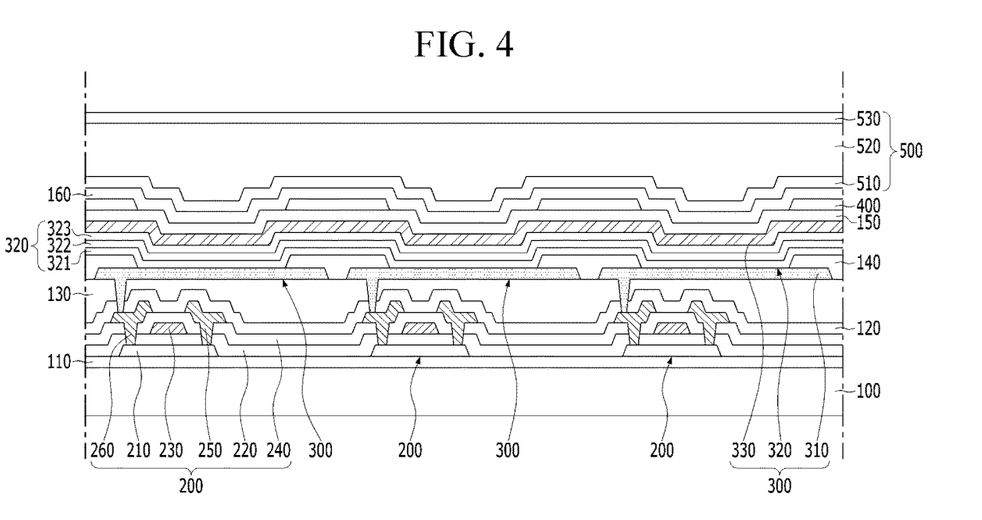

The display apparatus according to the aspect of the present disclosure is described that the emission material layer 322 of each light-emitting device 300 is separated from the emission material layer 322 of adjacent light-emitting device 300. However, in the display apparatus according to another aspect of the present disclosure, the light emitted from each light-emitting device 300 may display the same color as the light emitted from adjacent light-emitting device 300. For example, in the display apparatus according to another aspect of the present disclosure, the light-emitting layer 320 of each light-emitting device 300 may be coupled to the light-emitting layer 320 of adjacent light-emitting device 300, as shown in FIG. 4. The light-emitting layer 320 may extend on the bank insulating layer 140 along the second electrode 330. For example, the first emission common layer 321 of the light-emitting layer 320 may completely cover the bank insulating layer 140 on the over-coat layer 130. Thus, in the display apparatus according to another aspect of the present disclosure, the degree of freedom in the process of forming the light-emitting layer 320 may be improved.

Figure 5:
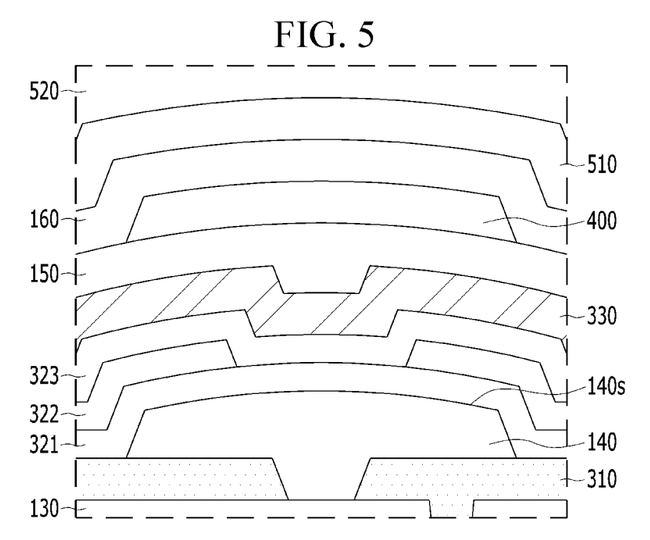

The display apparatus according to the aspect of the present disclosure is described that the surface of the bank insulating layer 140 toward the insulation pattern 400 is a flat surface. However, the display apparatus according to another aspect of the present disclosure may include the insulation pattern 400 on a surface of the bank insulating layer 140 having a curvature. For example, in the display apparatus according to another aspect of the present disclosure, the surface of the bank insulating layer 140 toward the insulation pattern 400 may have a convex shape toward the insulation pattern 400, as shown in FIG. 5. Thus, in the display apparatus according to another aspect of the present disclosure, the light which is generated from a region on the bank insulating layer 140, and travels in a direction perpendicular to a surface of the device substrate 100 may be minimized. That is, in the display apparatus according to another aspect of the present disclosure, the light reflected in the interface of the insulation pattern 400 and the second capping layer 160 may be maximized. Therefore, in the display apparatus according to another aspect of the present disclosure, the emission of the light generated from the unintended area may be effectively prevented.

Figure 6:
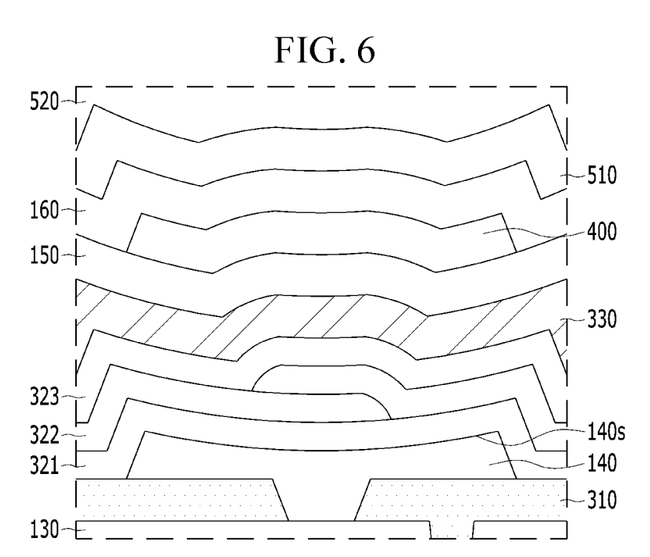

As shown in FIG. 6, the display apparatus according to another aspect of the present disclosure may include the bank insulating layer in which a surface toward the insulation pattern 400 is a concave shape. Thus, in the display apparatus according to another aspect of the present disclosure, a thickness difference due to an end of each emission material layer 322 on the bank insulating layer 140 may be relieved by a shape of the bank insulating layer 140. For example, in the display apparatus according to another aspect of the present disclosure, the emission material layer 322 of each light-emitting device 300 may overlap the emission material layer 322 of adjacent light-emitting device 300 on the surface of the bank insulating layer 140 toward the insulation pattern 400. Therefore, in the display apparatus according to another aspect of the present disclosure, the emission of the light generated from an unintended area may be effectively prevented, and the process efficiency may be improved.

Figure 7:
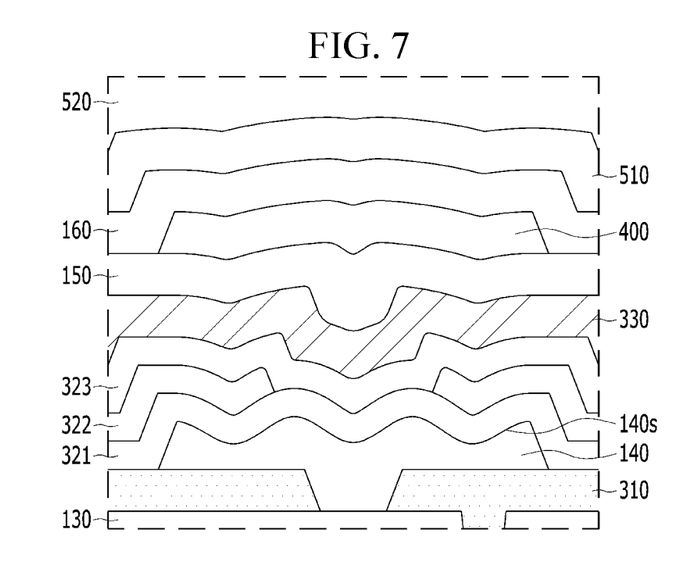

As shown in FIG. 7, the display apparatus according to another aspect of the present disclosure may include the bank insulating layer in which a surface toward the insulation pattern 400 is a convex-concave shape. Thus, in the display apparatus according to another aspect of the present disclosure, the interface between the insulation pattern 400 and the first capping layer 150 and the interface between the insulation pattern 400 and the second capping layer 160 may have a curvature on the bank insulating layer 140. Therefore, in the display apparatus according to another aspect of the present disclosure, the reflection of the light generated from an unintended area and the external light travelling toward the bank insulating layer 140 may be effectively preformed.

In the result, the display apparatus according to the aspects of the present disclosure may include the first capping layer, the insulation pattern and the second capping layer which are sequentially stacked on the bank insulating layer, wherein the insulation pattern has a refractive index greater than that of the first capping layer and the second capping layer. Thus, in the display apparatus according to the aspects of the present disclosure, the emission of the light unintentionally generated from a region on the bank insulating layer may be minimized. Therefore, in the display apparatus according to the aspects of the present disclosure, the variation of the color coordinates and the quality deterioration of the image due to the emission of the light generated from an unintended area may be prevented.

What is claimed is:

1. A display apparatus comprising:
    a bank insulating layer disposed on a device substrate and defining an emission area;
    a light-emitting device including a first electrode, a light-emitting layer and a second electrode, which are sequentially stacked on the emission area;
    a first capping layer disposed on the light-emitting device and extending on the bank insulating layer;
    an insulation pattern disposed on the first capping layer and overlapping with the bank insulating layer outside the emission area; and
    a second capping layer disposed on the first capping layer and covering the insulation pattern,
    wherein both lateral ends of the insulation pattern and the bank insulating layer overlap with each other and the insulation pattern is encapsulated by the first capping layer and the second capping layer,
    wherein each of the first capping layer and the second capping layer includes a region overlapping with the insulation pattern outside the emission area, and
    wherein the insulation pattern has a refractive index greater than those of the first capping layer and the second capping layer.

2. The display apparatus according to claim 1, wherein the insulation pattern is in contact with the first capping layer and the second capping layer.

3. The display apparatus according to claim 1, wherein the first capping layer is in contact with the second electrode and has a refractive index smaller than that of the second electrode.

4. The display apparatus according to claim 3, wherein the light-emitting layer includes an emission material layer and an emission common layer, the emission common layer disposed between the emission material layer and the second electrode, and
    wherein the emission common layer being in contact with the second electrode has a refractive index smaller than that of the second electrode.

5. The display apparatus according to claim 3, wherein the insulation pattern has a refractive index greater than that of the second electrode.

6. The display apparatus according to claim 1, wherein the insulation pattern includes a metal oxide.

7. The display apparatus according to claim 1, wherein the second capping layer includes a material different from the first capping layer.

8. The display apparatus according to claim 7, wherein the first capping layer includes an organic insulating material.

9. The display apparatus according to claim 1, wherein the bank insulating layer has a surface with a curvature toward the insulation pattern.

10. The display apparatus according to claim 9, wherein the surface of the bank insulating layer toward the insulation pattern has a convex shape toward the insulation pattern.

11. The display apparatus according to claim 1, each of the both lateral ends of the insulation pattern includes a lower surface contacting the first capping layer and an upper surface contacting the second capping layer.

12. The display apparatus according to claim 1, wherein the both lateral ends of the insulating pattern does not overlap the emission area.

13. The display apparatus according to claim 1, wherein a portion of the second capping layer contacting the first capping layer includes a region overlapping with the bank insulating layer at the outside of the insulating pattern.

14. A display apparatus comprising:
    a first electrode on a device substrate;
    a bank insulating layer disposed on the device substrate and covering an edge of the first electrode;
    an emission material layer disposed on a portion of the first electrode where the bank insulating layer is exposed, the emission material layer including a region overlapping with the bank insulating layer;
    a second electrode disposed on the emission material layer and having a higher transmittance than that of the first electrode;
    an insulation pattern disposed on the bank insulating layer and disposed outside the portion of the first electrode where the bank insulating layer is exposed;
    a first capping layer disposed between the bank insulating layer and the insulation pattern and in contact with a surface of the insulation pattern toward the bank insulating layer; and
    a second capping layer on the insulation pattern and in contact with a surface of the insulation pattern opposite to the bank insulating layer,
    wherein both lateral ends of the insulation pattern and the bank insulating layer overlap with each other and the insulation pattern is encapsulated by the first capping layer and the second capping layer,
    wherein each of the first capping layer and the second capping layer includes a region overlapping with the insulation pattern outside the emission area, and
    wherein the first capping layer and the second capping layer have a refractive index smaller than that of the insulation pattern.

15. The display apparatus according claim 14, wherein the insulation pattern has a horizontal width that is equal to a horizontal width of the bank insulating layer.

16. The display apparatus according to claim 14, further comprising an encapsulating element disposed on the second capping layer,
    wherein the encapsulating element includes a portion disposed outside the bank insulating layer, and
    wherein each of the first capping layer and the second capping layer includes a portion disposed between the second electrode and the encapsulating element.

17. The display apparatus according to claim 16, wherein the second capping layer has a refractive index the same as the first capping layer.

18. The display apparatus according to claim 16, wherein the encapsulating element has a stacked structure of encapsulating layer, and
    wherein an encapsulating layer being in contact with the second capping layer includes an organic insulating material.

19. The display apparatus according to claim 14, wherein the bank insulating layer has a surface toward the insulation pattern that has a convex-concave shape.

* * * * *